United States Patent
Jeon et al.

(10) Patent No.: US 7,078,295 B2
(45) Date of Patent: Jul. 18, 2006

(54) SELF-ALIGNED SPLIT-GATE NONVOLATILE MEMORY STRUCTURE AND A METHOD OF MAKING THE SAME

(75) Inventors: Hee Seog Jeon, Hwasung (KR); Seung Beom Yoon, Suwon (KR); Yong Tae Kim, Youngin (KR)

(73) Assignee: Samsung Electronics Co., Ltd., Gyeonggi-do (KR)

( * ) Notice: Subject to any disclaimer, the term of this patent is extended or adjusted under 35 U.S.C. 154(b) by 0 days.

(21) Appl. No.: 10/834,082

(22) Filed: Apr. 29, 2004

(65) Prior Publication Data
US 2005/0167729 A1    Aug. 4, 2005

(30) Foreign Application Priority Data
Feb. 4, 2004    (KR) .................... 10-2004-0007230

(51) Int. Cl.
*H01L 21/336*    (2006.01)
(52) U.S. Cl. .................... 438/261; 438/257; 438/266; 438/267
(58) Field of Classification Search ............... 438/257, 438/258, 259, 260, 261, 262, 263, 264, 265, 438/266, 267
See application file for complete search history.

(56) References Cited
U.S. PATENT DOCUMENTS

| | | | |
|---|---|---|---|
| 6,329,685 B1 | 12/2001 | Lee | |
| 6,362,048 B1 | 3/2002 | Huang et al. | |
| 6,429,472 B1 | 8/2002 | Kim et al. | |
| 6,469,341 B1 * | 10/2002 | Sung et al. | 438/266 |
| 6,486,508 B1 | 11/2002 | Lee | |
| 6,524,915 B1 | 2/2003 | Kim et al. | |
| 6,562,673 B1 | 5/2003 | Lin et al. | |
| 6,589,842 B1 | 7/2003 | Huang et al. | |
| 6,767,792 B1 * | 7/2004 | Wen et al. | 438/257 |
| 2002/0034846 A1 | 3/2002 | Wang | |
| 2005/0101090 A1 * | 5/2005 | Chuang et al. | 438/267 |
| 2005/0106816 A1 * | 5/2005 | Choi et al. | 438/261 |
| 2005/0127435 A1 * | 6/2005 | Chen et al. | 257/327 |
| 2005/0167729 A1 * | 8/2005 | Jeon et al. | 257/314 |

* cited by examiner

*Primary Examiner*—Walter L. Lindsay, Jr.
(74) *Attorney, Agent, or Firm*—Harness, Dickey & Pierce

(57) ABSTRACT

Provided are non-volatile split-gate memory cells having self-aligned floating gate and the control gate structures and exemplary processes for manufacturing such memory cells that provide improved dimensional control over the relative lengths and separation of the split-gate elements. Each control gate includes a projecting portion that extends over at least a portion of the associated floating gate with the size of the projecting portion being determined by a first sacrificial polysilicon spacer that, when removed, produces a concave region in an intermediate insulating structure. The control gate is then formed as a polysilicon spacer adjacent the intermediate insulating structure, the portion of the spacer extending into the concave region determining the dimension and spacing of the projecting portion and the thickness of the interpoly oxide (IPO) separating the upper portions of the split-gate electrodes thereby providing improved performance and manufacturability.

26 Claims, 8 Drawing Sheets

SELF-ALIGNED SPLIT-GATE NONVOLATILE MEMORY STRUCTURE AND A METHOD OF MAKING THE SAME

CROSS REFERENCE TO RELATED APPLICATIONS

This U.S. nonprovisional patent application claims priority under 35 U.S.C. § 119 from Korean Patent Application No. 10-2004-0007230, which was filed on Feb. 4, 2004, in the Korean Intellectual Property Office, the entire contents of which are hereby incorporated by reference.

BACKGROUND OF THE INVENTION

1. Field of the Invention

The present invention is directed to split-gate memory cells and semiconductor devices that include such memory cells. More particularly, the present invention is directed to split-gate memory cells in which the floating gate and the control gate are self-aligned with the control gate at least partially overlapping the control gate and a method of manufacturing such split-gate memory cells.

2. Description of the Related Art

Semiconductor memory cells utilizing floating gates that may be charged to alter the performance of the associated channel regions and control gates have been manufactured in a variety of configurations. Such memory cells are used in forming non-volatile memory arrays and devices, whereby stored data may be maintained for a relatively long period of time without consuming power or requiring frequent refreshing. Such devices are particularly useful in applications where power is unavailable for long periods or frequently interrupted or, in battery dependent applications, when low power consumption is desired.

As a result, these types of devices are frequently found in applications such as mobile communications equipment, memory blocks incorporated in microprocessor or microcomputer chips, and memories widely used for storing music and/or image data. The floating gate memory cells can be arranged in either split-gate or stacked gate configurations, and a combination of the two configurations may be included on a single device.

Split-gate memory cell transistors offer several advantages over conventional flash memories including bite operation (8 bit write/erase), relatively low programming currents of about 1 µA, good resistance to interference with the control gate used as the select transistor, and higher speeds provided by the use of hot carrier injection. Split-gate memory cell transistors also have several disadvantages including a larger size than a corresponding flash cell and lower endurance than a corresponding EEPROM (electrically erasable programmable read only memory) utilizing F-N (Fowler-Nordheim) tunneling injection.

A problem associated with the manufacture of floating gate memory cell arrays has been the alignment of the various functional elements including the source, drain(s), control gate(s), and floating gate(s). As the design rules for higher degrees of integration continue to decrease the size and spacing of these various elements, the need for precise and controllable alignment increases. The proper relative alignment and orientation of the various memory cell elements results in increased manufacturing yield, reduced performance distribution and increased reliability of the final semiconductor products.

Self-alignment is a well known technique in semiconductor manufacturing by which certain processing steps and the resulting structures are arranged and configured whereby certain elements, such as CMOS gate electrodes and the adjacent source/drain regions, are automatically aligned to one another as a result of the particular processing sequence, thereby avoiding the need to rely on the alignment of multiple photolithography patterns.

In the split-gate memory cell configuration, the control-gate field effect transistor (FET) plays a major role in determining the programming injection efficiency for source-side-injection cells. Good process control of the control gate length, $L_{cg}$, (which may also be referred to as the WL (word-line) poly length), i.e., the length of the control or select gate that is arranged over the channel region, can provide full turn-off of the control-gate device and reduce the likelihood of interference or disturbance during the programming of mirror cells.

A problem associated with the manufacture of split-gate memory cells can be a mismatch of the lengths and positioning of the paired control gates. As illustrated in FIG. 1, two control gates are arranged on either side of a common source region and over a portion of the channel between the source region and a corresponding drain region. If the control gate lengths $L_{cg1}$ and $L_{cg2}$ are not substantially identical, the amount of current flowing between the source and drain will be different and the operation of the two mirror cells will differ accordingly.

Data may be stored in such a split-gate memory cell by utilizing the changes in the current flowing through the respective transistors as a function of the status of the floating gates 104a as charged (program) or discharged (erase). During a charging (program) operation, electrons can be injected into the floating gate 104a by, for example, applying a relatively high voltage, e.g., 8–12 V, to the common source, an intermediate voltage, e.g., 1–3 V, to the corresponding control gate 120, and a relatively low voltage, e.g., 0–0.5 V, to the corresponding drain 126, while holding the substrate near ground, 0 V. As the floating gate 104a accumulates electrons via the resulting channel hot electron injection (CHEI) mechanism, the effective threshold voltage, $V_{th}$, of the transistor will increase, typically to a level above about 3 V.

Conversely, during a discharging (erase) operation electrons can be withdrawn from the floating gate 104a by, for example, applying a relatively high voltage, e.g., 8–12 V, to the control gate 120 while holding the common source 116, the corresponding drain 126 and the substrate 100 at or near ground, 0 V. As the floating gate 104a discharges its accumulated electrons via the resulting Fowler-Nordheim (F-N) tunneling mechanism, the effective threshold voltage, $V_{th}$, of the transistor will decrease, typically to a level below about 1 V and may even decrease to a level below 0 V.

Once programmed or erased, the split-gate memory as illustrated in FIG. 1 may be read by applying a read voltage of about 2 V to the control gate 120, applying about 1 V to the drain 126, and holding the source 116 and the substrate 100 at or near ground, 0V. If the floating gate is charged when read, the $V_{th}$ will be sufficiently above the read voltage that the transistor will remain "off." Conversely, if the floating gate is discharged when read, the $V_{th}$ will be sufficiently below the read voltage to ensure that the transistor will be "on." As will be appreciated, the sizing and doping of the split-gate transistor elements, selected in consideration of the performance requirements for the final semiconductor product, will determine the precise ranges of voltages and currents required to operate such a transistor.

As shown in FIG. 1, a split-gate memory cell has a structure wherein the floating gates 104a and the corresponding control gates 120 are arranged on opposite sides of a common source region 116 and separated from each other by insulating material(s). The floating gates 104a are also electrically insolated by the surrounding insulating materials from external current sources.

The insulating material 200 between the substantially vertical portions of the floating gate 104a and the control gate 120 may be referred to as an intergate insulating layer, tunneling insulator or tunneling oxide. The insulating material 204 between the floating gate 104a and the substrate 100 may be referred to as the coupling insulator or coupling oxide. Similarly, the insulating material 206 between the control gate 120 and the substrate 100 may be referred to as the gate insulator or gate oxide.

The insulating materials 204 and 206, for example, may be formed at different stages during the manufacturing process and may, therefore, be somewhat different in composition and/or thickness. The insulating material 202 between the upper side of the floating gate 104a and the control gate 120 may be referred to as the interpoly oxide (IPO).

Each of these insulating regions 200, 202, 204, 206, will, in turn, have an associated capacitance, i.e., $C_{tun}$, $C_{IPO}$, $C_c$, $C_g$, that contributes to a total capacitance $C_{tot}$ for the split-gate transistor. These capacitances will also affect the voltage that can be applied to the floating gate 104a to produce the electrical field that, in turn, produces and directs the hot electrons to the floating gate during the charging (program) operation. During the program step, the voltage $V_{fg}$ induced at the floating gate 104a will generally correspond to the voltage applied to the common source $V_s$ according to equation I.

$$V_{fg} = V_s * (C_c/C_{tot}) \qquad \text{I}$$

Accordingly, the magnitude of $C_c/C_{tot}$ is a factor that must be considered when designing a split-gate transistor. Higher values of $C_c/C_{tot}$ allow higher voltages to be induced in the floating gate, thereby increasing the electron injection (program) efficiency of the transistor.

Similarly, during a discharge (erase) operation, the electrons move from the floating gate to the control gate by F-N tunneling through the tunnel insulating layer 200 and/or the interpoly oxide 202. In this case, the voltage $V_{fg}$ induced at the floating gate 104a will generally correspond to the voltage applied to the control gate $V_{cg}$ according to equation II.

$$V_{fg} = V_{cg} * ((C_{tot} - C_{IPO} - C_g)/C_{tot}) \qquad \text{II}$$

Accordingly, for improved performance, it is desirable to increase $C_{IPO}$, thereby decreasing the effective voltage on the floating gate $V_{fg}$. Decreases in $V_{fg}$ during discharge operations will affect the endurance characteristics of the memory cell as well as the electron discharge (erase) efficiency. Further, when utilizing the F-N tunneling mechanism, the tunnel current can be reduced by electron traps within the insulating layers, thereby degrading device performance. This degradation can be suppressed somewhat by increasing the effective voltage of the floating gate.

The relationship between the capacitance contributions of the tunneling $C_{tun}$ and interpoly oxide $C_{IPO}$ to the behavior of the floating gate can also be expressed as a coupling ratio $\alpha$ according to formula III.

$$\alpha = ((C_{tun} + C_{IPO})/C_{tot}) \qquad \text{III}$$

Certain manufacturing processes and the resulting floating gate structures, are illustrated and described in U.S. Pat. Nos. 6,329,685; 6,362,048; 6,429,472; 6,486,508; 6,524,915; 6,562,673 and 6,589,842, as well as U.S. Patent Application No. 2002/0034846, and are incorporated herein by reference, in their entirety.

SUMMARY OF THE INVENTION

Exemplary embodiments of split-gate transistors according to the present invention provide self-alignment of the control gates and floating gates and provide an increased degree of control over the tunneling and interpoly oxides. These process and structural improvements translate into improved program/erase efficiency, endurance characteristics and device-to-device uniformity.

An exemplary method of forming a split-gate transistor according to the invention comprises, performing, in order, the steps of forming a first insulating layer on a substrate; forming a first semiconductor layer on the first insulating layer; forming a second insulating layer on the first semiconductor layer; forming a third insulating layer on the second insulating layer; patterning and etching the third insulating layer to form an opening that exposes a portion of the second insulating layer, the opening having substantially vertical sidewalls; oxidizing a portion of the first semiconductor layer to form a semiconductor oxide layer; depositing a second semiconductor layer; etching the second semiconductor layer using an anisotropic etch to form spacers adjacent the sidewalls of the opening and expose a portion of the semiconductor oxide layer; etching the exposed portion of the semiconductor oxide layer to expose a portion of the first semiconductor layer; etching the exposed portion of the first semiconductor layer to expose a portion of the first insulating layer; depositing a fourth insulating layer to a thickness sufficient to fill the opening; removing an upper portion of the fourth insulating layer to expose a surface of the third insulating layer and produce a substantially planar surface; removing the third insulating layer while substantially retaining the spacers to form a base structure; removing the second insulating layer; etching the first semiconductor layer using the base structure as an etch mask to expose the first insulating layer and to form floating gate structures; forming an insulating layer on the floating gate structures; depositing a third semiconductor layer, the third semiconductor layer substantially conforming to a surface of the base structure; etching the third semiconductor layer to form control gate structures adjacent the sidewalls of the base structure, wherein each of the control gate structures is paired with but is insulated from a corresponding floating gate structure, and further wherein a portion of each control gate structure at least partially overlays a corresponding floating gate structure; and depositing a fourth insulating layer to insulate the control gate structures.

Also disclosed is an exemplary method of forming a non-volatile split-gate memory cell that comprises performing, in order, the steps of forming a first insulating layer on a substrate; forming a first semiconductor layer on the first insulating layer; forming a second insulating layer on the first semiconductor layer; forming a third insulating layer on the second insulating layer; patterning and etching the third insulating layer to form an opening that exposes a portion of the second insulating layer, the opening having substantially vertical sidewalls; oxidizing a portion of the first semiconductor layer to form a semiconductor oxide layer; depositing a sidewall material layer; etching the sidewall material layer using an anisotropic etch to form spacers adjacent the sidewalls of the opening and to expose a portion of the semiconductor oxide layer; etching the exposed portion of the semiconductor oxide layer to expose a portion of the first semiconductor layer; etching the exposed portion of the first semiconductor layer to expose a portion of the first insulating layer; implanting a dopant species through the exposed portion of the first insulating layer to form a source region in a portion of the substrate; depositing a fourth insulating layer to a thickness sufficient to fill the opening; removing an upper portion of the fourth insulating layer to expose a surface of the third insulating layer and produce a substantially planar surface; removing the third insulating layer and the spacers to form an insulator structure, the insulator structure having sidewalls that include a recessed area; removing the second insulating layer; etching the first semiconductor layer using a remaining portion of the semiconductor oxide layer to expose the first insulating layer and form first conductor elements; forming a fifth insulating layer on the first conductor elements; depositing a second semiconductor layer, the second semiconductor layer substantially conforming to a surface of the insulator structure and filling the recessed area in the sidewalls; etching the second semiconductor layer to form semiconductor spacers adjacent the sidewalls of the insulator structure and expose a portion of the first insulating layer, wherein each of the semiconductor spacers is a second conductor element that is paired with and partially overlays a corresponding first conductor element; implanting a dopant species through the exposed portion of the first insulating layer to form a drain region in the substrate; forming an insulating layer to isolate the second conductor element, and establishing separate electrical connections to the source region, the drain region and the second conductor element.

Also disclosed is an exemplary method for forming complementary floating gate and control gate structures comprising the steps of forming an insulating structure, the insulating structure having a sidewall surface with a concave region and a protruding region, the protruding region being positioned below the concave region; using the protruding region of the insulating structure as an etch mask, etching a semiconductor layer to form a floating gate structure; forming an insulating layer on the floating gate structure to form an intermediate insulating structure having a side surface, the side surface including a concave region; and forming a control gate structure adjacent the intermediate insulating structure, wherein the control gate structure conforms to the side surface and includes a projecting portion that extends over a portion of the floating gate structure.

BRIEF DESCRIPTION OF THE DRAWINGS

The features and advantages of the present invention are described with reference to exemplary embodiments in association with the attached drawings in which similar reference numerals are used to indicate like or corresponding elements and in which.

Figure 1:
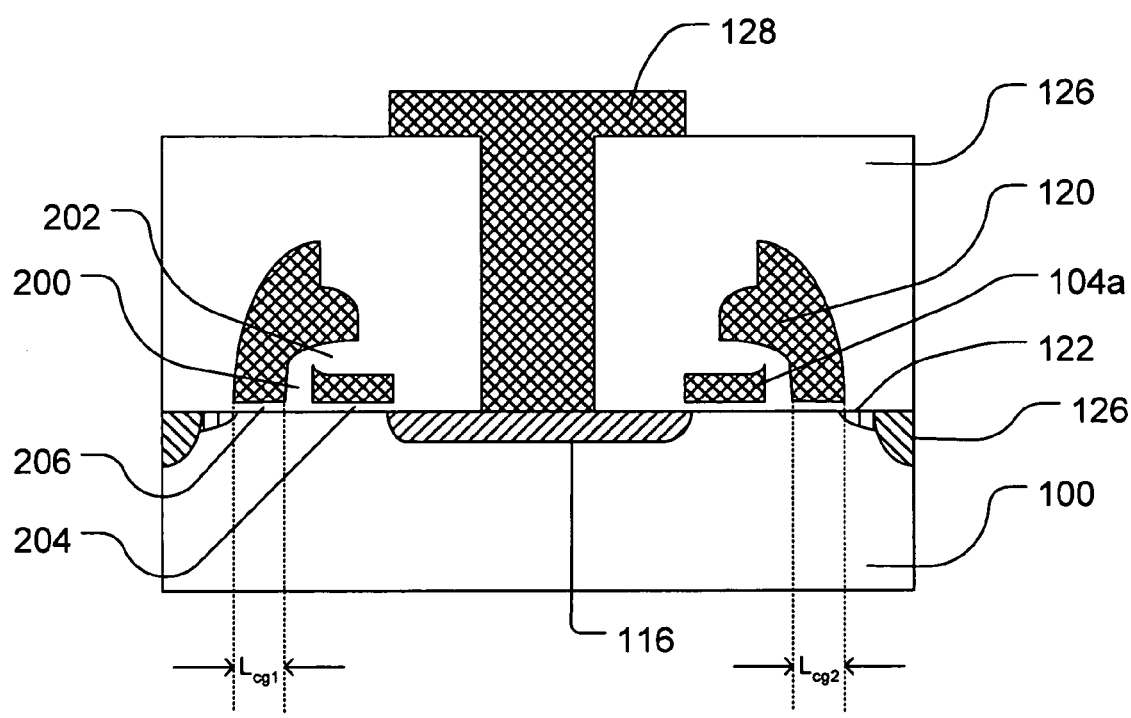
FIG. 1 illustrates a vertical cross-section of an exemplary split-gate transistor according to the present invention.

These drawings have been provided to assist in the understanding of the exemplary embodiments of the invention as described in more detail below and should not be construed as unduly limiting the invention. In particular, the relative spacing, sizing and dimensions of the various elements illustrated in the drawings are not drawn to scale and may have been exaggerated, reduced or otherwise modified for the purpose of improved clarity. Those of ordinary skill in the art will also appreciate that certain layers that may be commonly utilized in the manufacture of semiconductor devices including, for example, photoresist patterns and multilayer metallization structures, have been omitted simply to improve the clarity and reduce the number of drawings.

DETAILED DESCRIPTION OF EXEMPLARY EMBODIMENTS

Exemplary embodiments of a split-gate transistor structure and a method of manufacturing such as split-gate transistor structure according to the present invention will now be described more fully with reference to the accompanying drawings. As will be appreciated, this invention may, however, be embodied in many different forms and should not be construed as being limited to the embodiments set forth herein; rather, these embodiments are provided so that this disclosure will be thorough and complete, and will fully convey the concept of the invention to those of ordinary skilled in the art.

As used herein, layers or structures described as being "on" or "over" another layer or substrate, need not be formed or deposited directly on the referenced layer or substrate but should be understood to encompass one or more intervening layers. Similarly, when layers or structures are described as being "under" another layer or surface, the layer or structure need not be positioned directly under the referenced layer or surface but should be understood to encompass one or more intervening layers. Accordingly, the terms "adjacent" and "beside" should also be understood to describe a relative orientation, but should be understood to encompass intervening layers or materials.

Figure 2A:
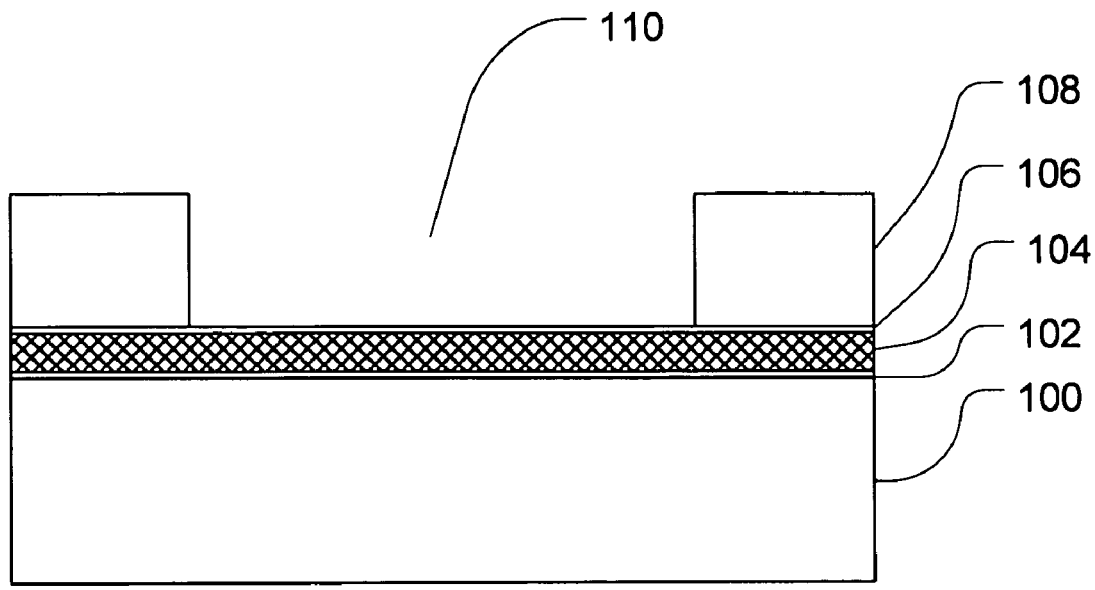
FIGS. 2A–M provide a series of vertical cross-sections illustrating certain of the process steps in an exemplary method of manufacturing a split-gate transistor as illustrated in FIG. 1.

An exemplary embodiment of a process according to the present invention is illustrated in FIGS. 2A–M. As illustrated in FIG. 2A, a semiconductor substrate 100, such as P-type silicon, is prepared and a first insulating layer 102 such as a silicon oxide, typically having a thickness of between about 50 and 150 Å, is formed thereon by oxidation of the substrate or by a deposition process. A first polysilicon layer 104, typically having a thickness of between about 500 and 1500 Å, is then formed on the first insulating layer 102. In light of its intended use, the first polysilicon layer 104 may also be referred to as the floating poly or FPoly. A second insulating layer 106, typically a thin silicon oxide layer having a thickness of between about 30 and 100 Å, is then formed on the first polysilicon layer 104, by, for example, oxidizing a portion of the first polysilicon layer.

A third insulating layer 108, for example a silicon nitride layer having a thickness of between about 2000 and 3000 Å, is then formed on the second insulating layer 106, typically using a chemical vapor deposition (CVD) process such as low pressure CVD (LPCVD), plasma enhanced CVD (PECVD) or other suitable deposition process. A photoresist layer (not shown) is then formed on the third insulating layer 108, exposed and developed to form a photoresist pattern that exposes a portion of the third insulating layer. The exposed portion of the third insulating layer 108 is then etched to form an opening or trench 110 that exposes a portion of the second insulating layer 106. The etch process utilized will preferably be one that exhibits a relatively high selectivity, e.g., greater than 10, for the third insulating layer 108 relative to the second insulating layer 106.

Figure 2B:
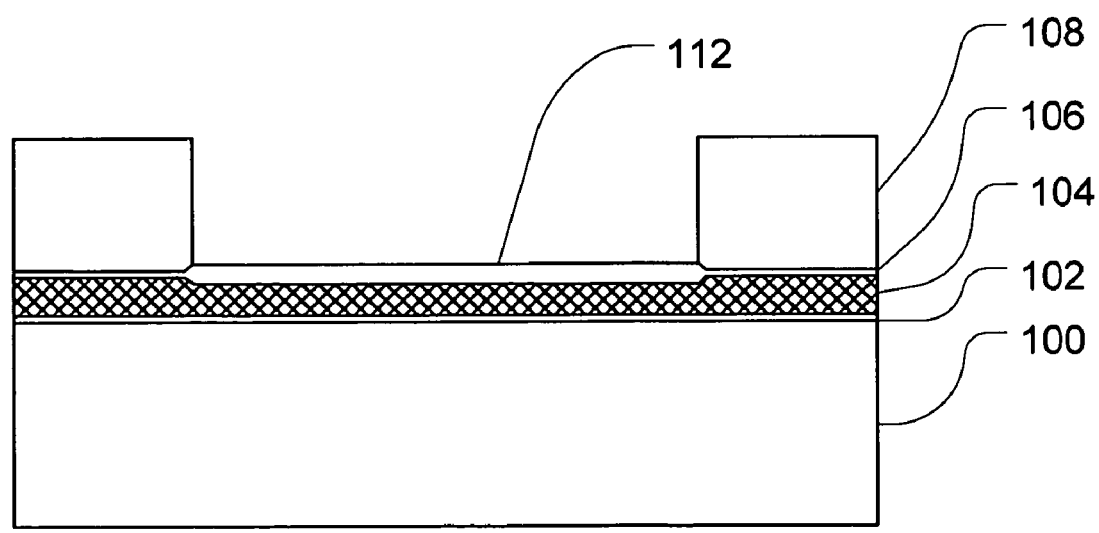

As illustrated in FIG. 2B, the exposed portion of the second insulating layer 106, and more specifically the underlying portion of polysilicon layer 104 are subjected to additional oxidation to form an FPoly oxide region 112 that also includes some "bird's beak" regions of reduced thickness extending under the edges of the third insulating layer 108 exposed within the trench 110. The FPoly oxide 112 will typically have a thickness of between about 500 and 1500 Å and may consume more than half of the thickness of the FPoly 104 during the oxidation.

Figure 2C:
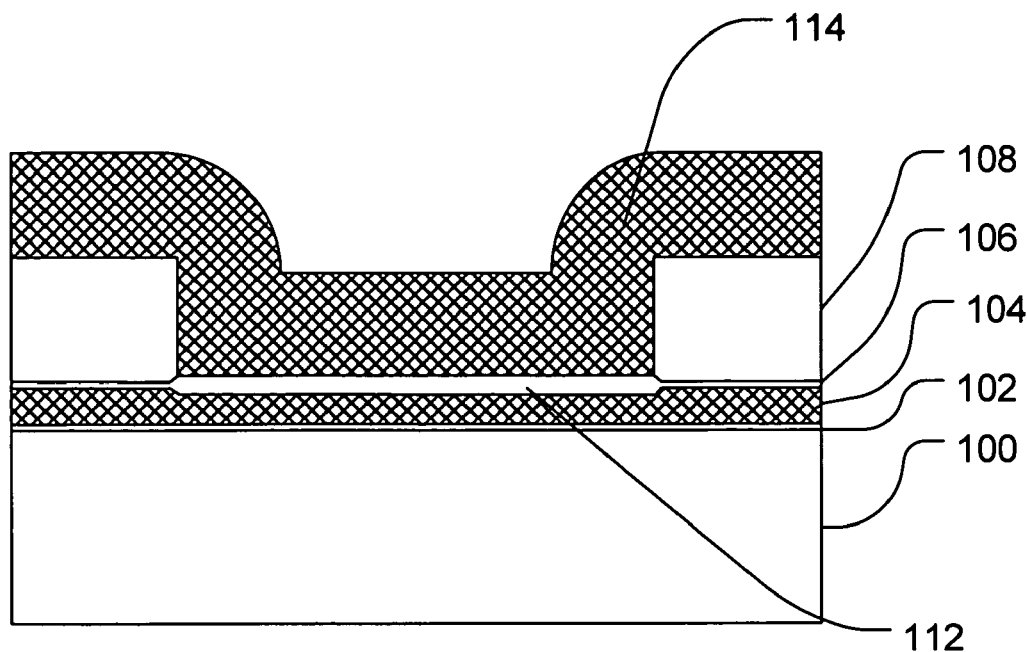

As illustrated in FIG. 2C, a second and generally conformal polysilicon layer 114 may then be deposited over the third insulating layer 108 and the FPoly oxide 112. This second polysilicon layer 114 will typically have a thickness of between about 1500 and 3000 Å.

Figure 2D:
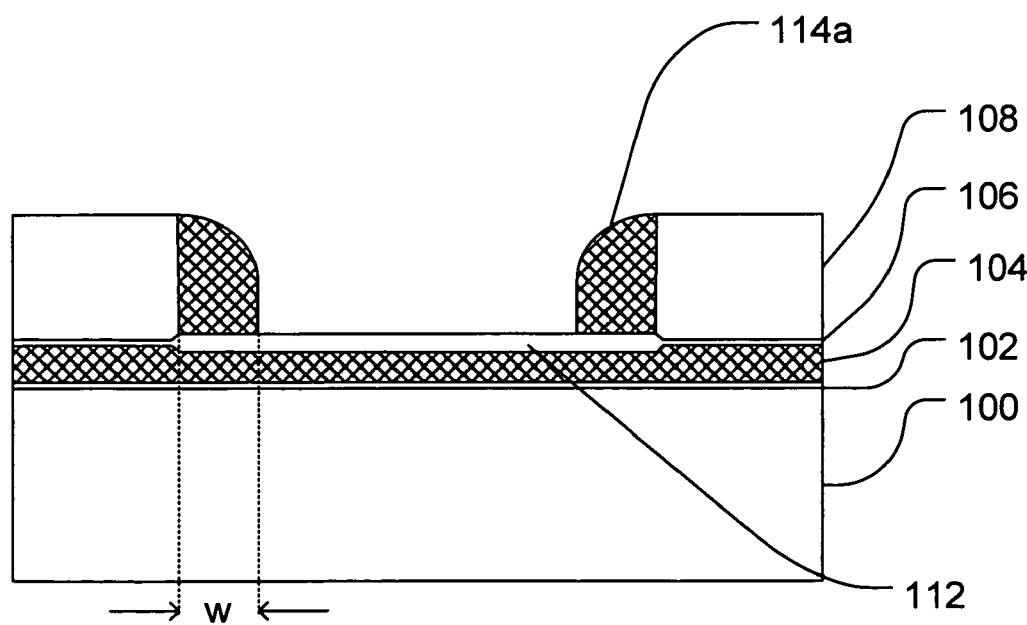

As illustrated in FIG. 2D, this second polysilicon layer 114 can then be subjected to an anisotropic etch process, such as reactive ion etching (RIE) to form polysilicon spacers 114a adjacent the sides of the trench 110. The polysilicon spacers 114a will be characterized by a bottom width w, typically between about 0.15 and 0.25 µm, covering a peripheral portion of the FPoly oxide 112. The portion of the polysilicon layer 114 formed in the central portion of the trench 110 will be removed during the spacer formation, thereby exposing a portion of the FPoly oxide 112.

Figure 2E:
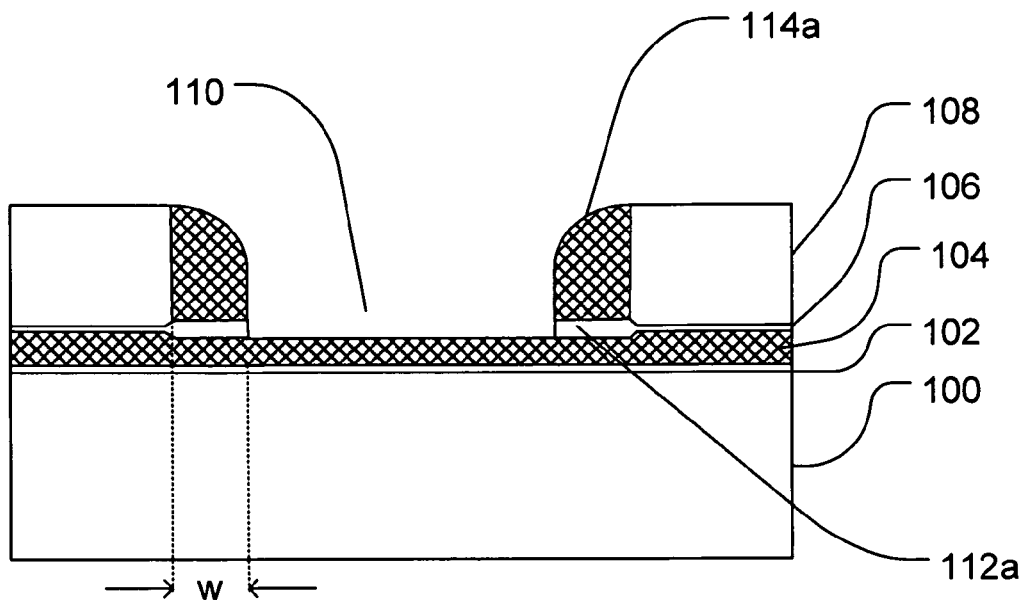
Figure 2F:
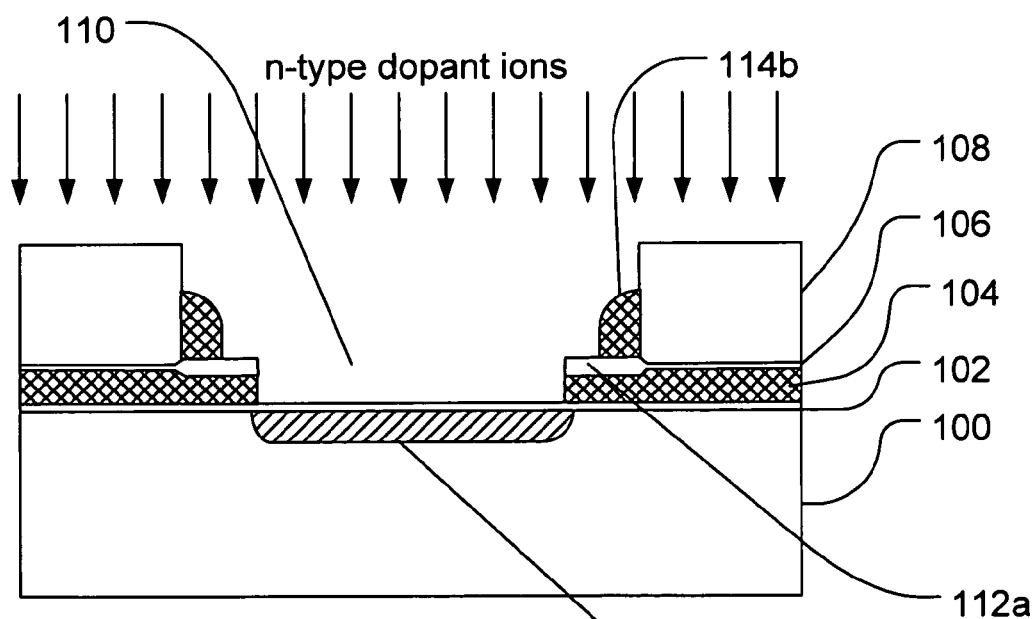

As illustrated in FIG. 2E, the exposed portion of the FPoly oxide 112, may then be removed to expose a portion of the FPoly 104 with the remaining portions of the FPoly oxide 112a left under the spacers 114a. As illustrated in FIG. 2F, the exposed portion of the FPoly 104 may then be removed to expose a portion of the first insulating layer 102. The etch process utilized to remove the exposed portion of the FPoly 104 will also tend to produce reduced polysilicon spacers 114b adjacent the sidewalls of the trench 110. The selectivity of the etch with regard to the exposed polysilicon regions 104, 114a and the first insulating layer 102, and the relative thickness of the first insulating layer, will determine how much of the polysilicon spacers 114a may be removed during this etch process and how much the bottom width w will be reduced. The final bottom width w may be on the order of 0.1 µm.

As also illustrated in FIG. 2F, once the exposed portion of the FPoly layer 104 is removed, the substrate may be implanted with a dopant species, for example an n-type dopant such as As or P at a dose on the order of about $10^{15}$ ions/cm$^2$ at an energy of about 40 KeV, to form the common source region for the transistors.

Figure 2G:
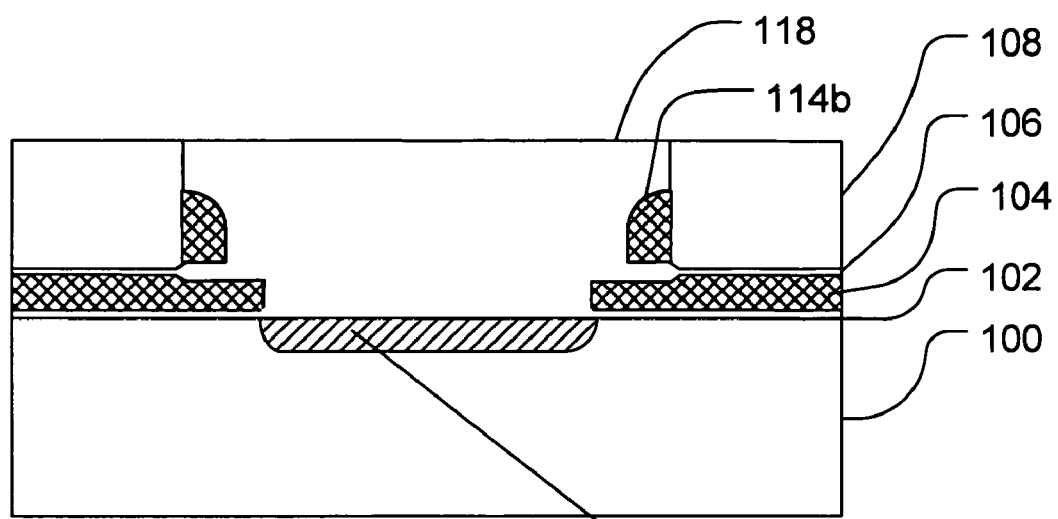

As illustrated in FIG. 2G, after completing the source implant, a thick silicon oxide layer (not shown) is then deposited on the substrate. This silicon oxide layer should have a thickness sufficient to fill the trench 110 completely and may be as thick as 15,000 Å. The upper portions of this silicon oxide layer are then removed, typically using a chemical mechanical polishing (CMP) process, to expose an upper surface of the third insulating layer 108. The remaining portion of the silicon oxide layer will form an isolated oxide structure 118 that completely fills the trench 110.

Figure 2H:
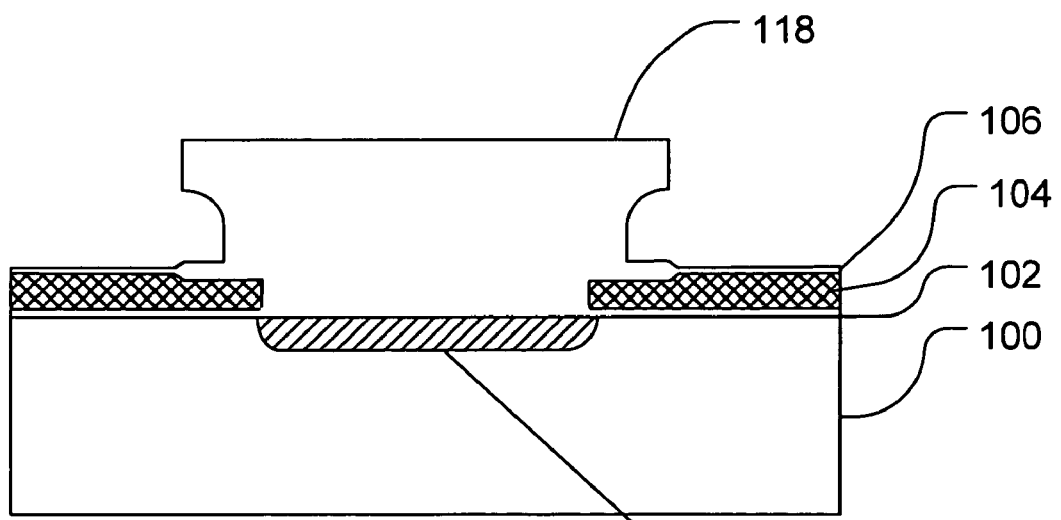

As illustrated in FIG. 2H, after forming the oxide structure 118, the third insulating layer 108 may be removed. In those instances in which the third insulating layer 108 is a silicon nitride, it may be removed using a wet etch process incorporating a hot aqueous solution, typically more than 150° C., of phosphoric acid, $H_3PO_4$. Once the third insulating layer 108 is removed, the reduced polysilicon spacers 114b are exposed and may be removed using a wet etch process incorporating an aqueous solution of ammonium hydroxide, $NH_4OH$. The exposed portions of the resulting structure include the oxide structure 118 and the remaining portions of the second insulating layer 106.

Figure 2I:
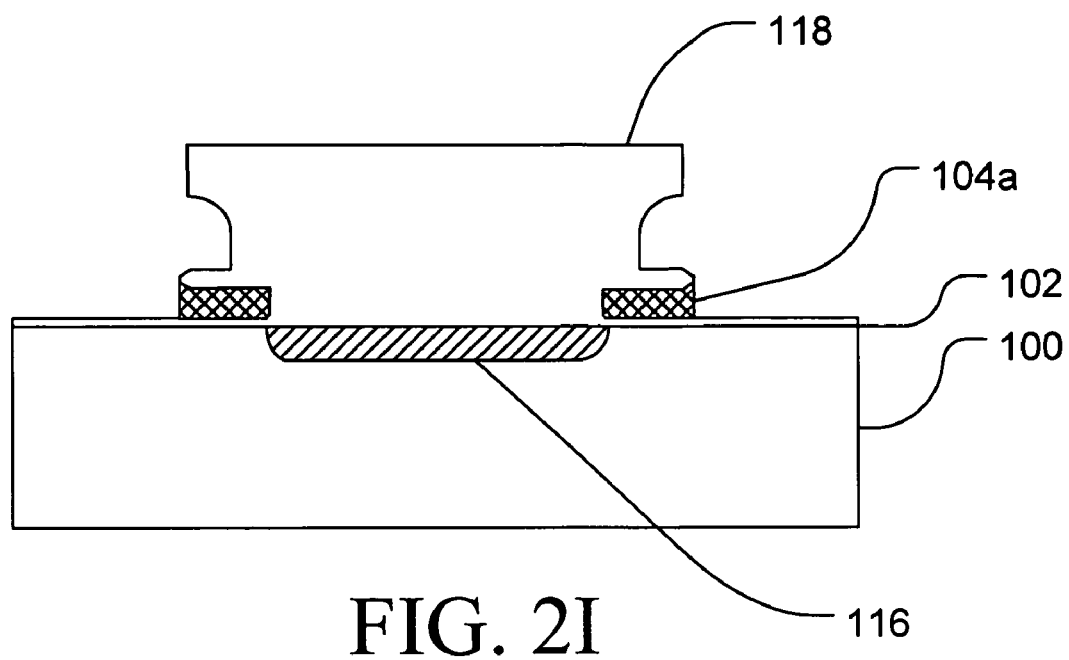

As illustrated in FIG. 2I, the remaining portions of the second insulating layer 106 are then removed, typically using either a wet etch or a dry etch to expose a portion of the FPoly 104 layer. Depending on the etch composition, the remaining portions of the second insulating layer 106 may be removed in conjunction with the removal of the reduced polysilicon spacers 114b. After removing the remaining portions of the second insulating layer 106, the exposed portions of the FPoly layer 104 may be etched using the oxide structure 118 as an etch mask to expose a portion of the first insulating layer 102. The remaining portions of the FPoly layer 104 will become the floating gate structures 104a.

Figure 2J:
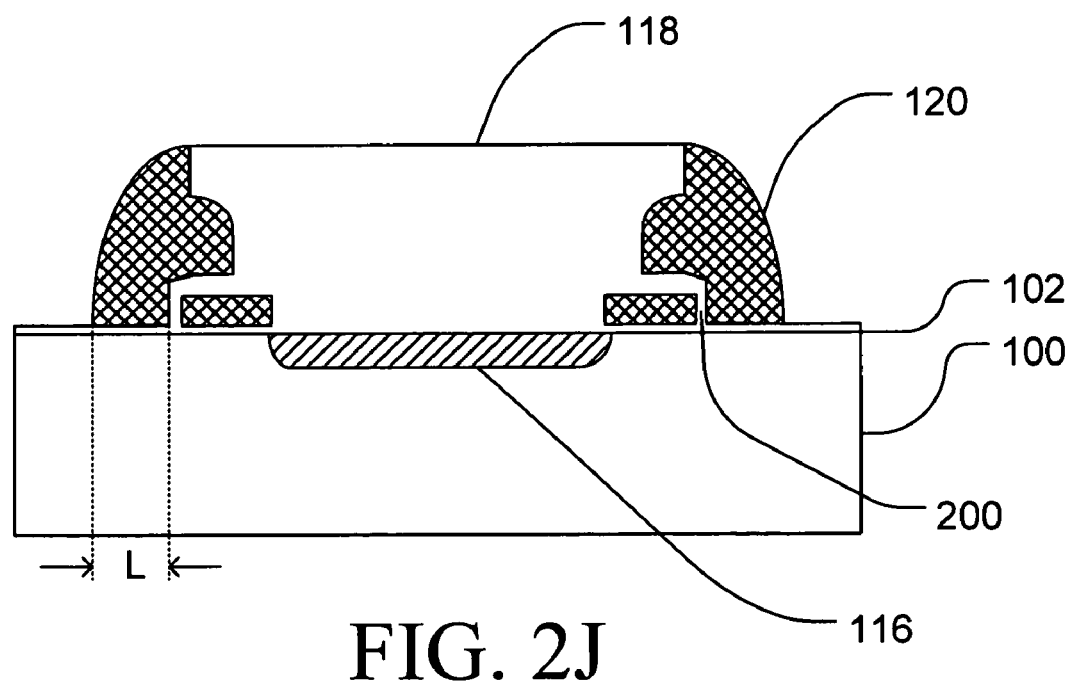

As illustrated in FIG. 2J, an insulating oxide layer, typically having a thickness of about 50 to 150 Å, is then formed on the exposed surfaces of the oxide structure 118 and the floating gate structures 104a through a thermal oxidation and/or CVD process to insulate the floating gate structures and form a gate oxide layer. A third polysilicon layer (not shown) is then deposited on the substrate to a thickness of about 2000 to 4000 Å and subjected to an anisotropic etchback process such as RIE, to form the control gate structures 120 adjacent the oxide structure 118. The control gate structures 120, which may also be referred to as word line polysilicon, will be characterized by a bottom length L extending from the tunneling oxide 200 and across the channel region of the substrate 100. This bottom length L may be controlled by the thickness of the deposited polysilicon layer, the etch chemistry and the extent of any overetch to provide a degree of dimensional control. A typical bottom length L may be in the range of about 0.20 to 0.35 µm.

Figure 2K:
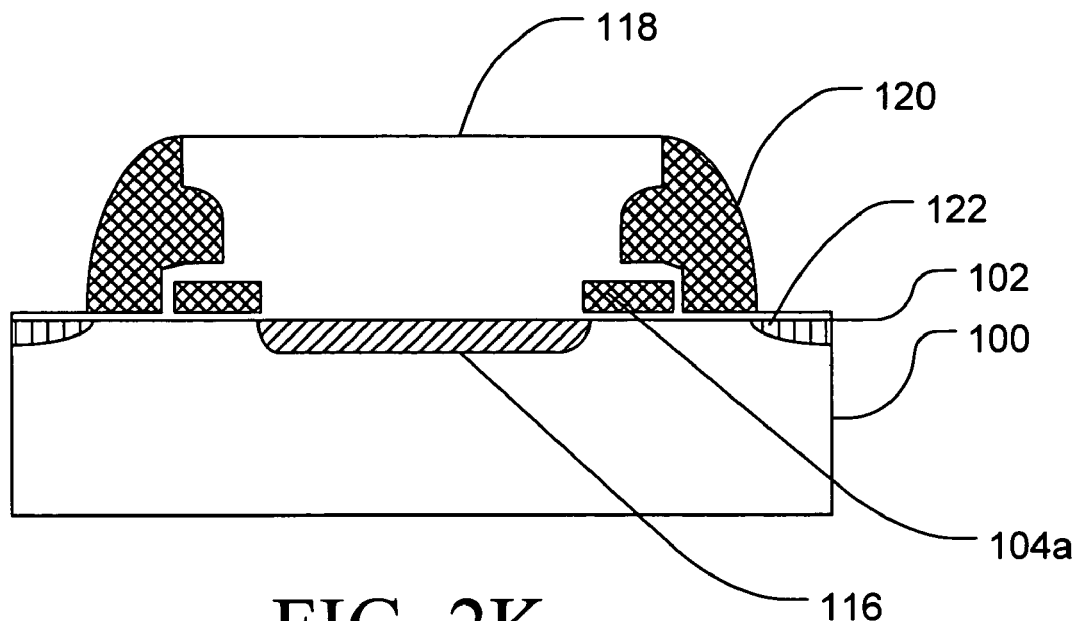
Figure 2L:
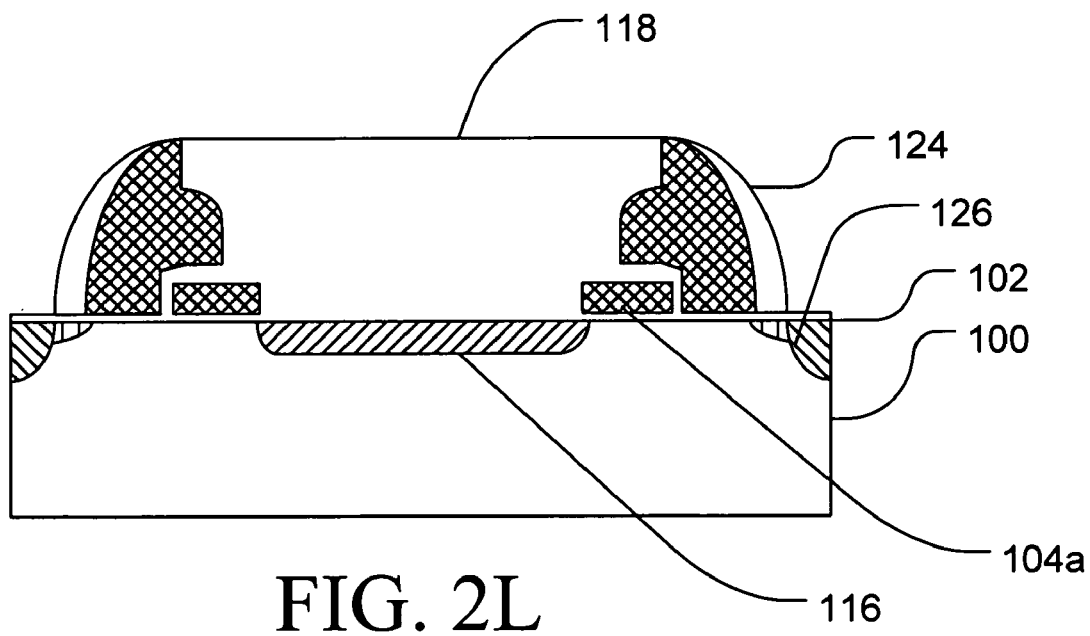

As illustrated in FIG. 2K, lightly doped drain (LDD) regions 122 may be formed in the substrate 100 utilizing the oxide structure 118 and the control gate structures 120 as an implant mask. Like the common source region 116, the LDD regions 122 may be formed by implanting one or more n-type dopants, usually As and/or P, at an energy of about 40 KeV, but with a reduced dose of about $10^{13}$ ions/cm$^2$ to form N− drain regions. After forming the LDD regions 122, as illustrated in FIG. 2L, an oxide layer (not shown) may be deposited on the substrate and subjected to an anisotropic etchback process, such as RIE, to form oxide spacers 124 adjacent the sides of the control gates 120. Using the oxide structure 118, the control gate structures 120 and oxide spacers 124 as an implant mask an additional heavier implant of an n-type dopant, usually As or P, may be implanted into the substrate to form N+ drain regions 126, typically using an implant energy and dose combination generally corresponding to that used to form the common source region. These concentrated drain regions may also be referred to as N+ bit line junctions.

Figure 2M:
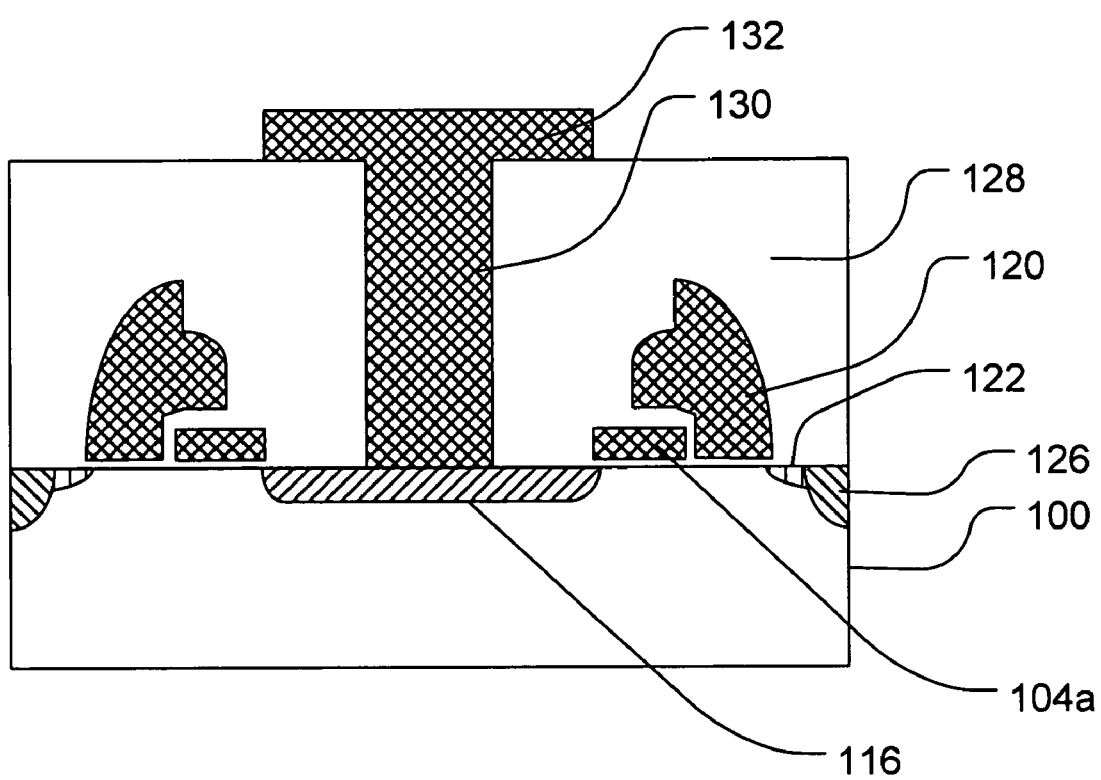

As illustrated in FIG. 2M, after formation of the N+ drain regions 126, a thick oxide layer 128, typically a CVD oxide having a thickness of about 10,000 to 15,000 Å, is deposited on the substrate. This oxide layer 128 may be planarized using a CMP process to provide a surface more suitable for patterning. A photoresist layer (not shown) may then be formed on the oxide layer 128, exposed and developed to form a contact pattern exposing portions of the oxide layer. The exposed portions of the oxide layer 128 may then be etched to form contact openings that extend to the source region 116, drain regions 126 (not shown) and control gates 120 (not shown). After removing the photoresist pattern, the contact openings may be filled with one or more conductive materials, typically including an initial barrier metal comprising a combination of Ti and TiN, followed by the deposition of another metal layer, such as W, that will fill the remainder of the contact openings, followed by a CMP process to remove the upper portions of the metal layer and form contact plugs 130 that provide electrical connections to the underlying elements. A process utilizing tungsten, for instance, may include the deposition of a W layer having a thickness of about 2000 to 3000 Å followed by a tungsten CMP process to expose an upper surface of the thick oxide 128 and form W plugs in the contact openings.

After the contact openings have been filled with a conductive material, another metal layer of, for example, aluminum or an aluminum alloy, may be formed on the substrate. This metal layer may then be patterned and etched for the purpose of forming a layer of metal interconnects 132. As will be appreciated, if necessary or desired, additional metallization layers (not shown) may be formed by depositing an interlayer insulator (not shown), opening vias to the first layer of metal interconnects 132, forming conductive via plugs (not shown) and a second layer of metal interconnects (not shown).

As will be appreciated, by controlling the formation of the first polysilicon spacers 114a, the insulating layer(s) formed on the floating gate 104a, and the control gate structures 120, this exemplary embodiment of a manufacturing process according to the present invention provides an improved degree of control over the relative sizing and positioning of the floating gate 104a and the control gate 120 as well as the insulating materials arranged between the control gate and the floating gate. This improved control, coupled with the self-aligned configuration, provides a method for producing split-gate memory devices having more consistent performance and improved efficiency. Further, this improved control over the relative sizing of the gate structures allows the production of devices having increased program/erase efficiency and improved endurance characteristics.

Although this invention has been described with reference to exemplary embodiments, it should be understood that the present invention is not so limited and that those of ordinary skill in the art will recognize that various modifications, particularly with respect to the composition and relative thickness of the various layers may be made without departing from the spirit and the scope of the invention as defined by the following claims.

What is claimed is:

1. A method of forming a split-gate transistor comprising, in order:
   a) forming an insulating structure, the insulating structure having a sidewall surface with a concave region and a protruding region, the protruding region being positioned below the concave region;
   b) using the protruding region of the insulating structure as an etch mask, etching a semiconductor layer to form a floating gate structure;
   c) forming an insulating layer on the floating gate structure to form an intermediate insulating structure incorporating the floating gate structure and having a side surface, the side surface including a concave region; and
   d) forming a control gate structure adjacent the intermediate insulating structure, wherein the control gate structure conforms to the side surface and includes a projecting portion that extends over a portion of the floating gate structure.

2. A method of forming a split-gate transistor according to claim 1, further comprising:
   forming a common source region in a substrate prior to forming the insulating structure;
   forming a drain region in the substrate after forming the control gate structure;
   forming a thick insulating layer after forming the drain region;
   forming a plurality of contact openings through the thick insulating layer whereby electrical contact may be separately established to the common source, the drain and the control gate structure.

3. A method of forming a split-gate transistor according to claim 2, further comprising:
   depositing a layer of Ti within the contact openings;
   depositing a layer of TiN on the layer of Ti within the contact opening;
   depositing a layer of W on the layer of TiN within the contact opening;
   planarizing the substrate to expose a surface of the thick insulating layer and create tungsten plugs filling the contact openings.

4. A method of forming a split-gate transistor according to claim 2, wherein:
   forming the concave region includes forming a sacrificial polysilicon spacer in a trench formed in a nitride layer, the polysilicon spacer being formed adjacent a trench wall;
   filling the remainder of the trench with silicon oxide and planarizing the silicon oxide to expose an upper surface of the nitride layer;
   removing the nitride layer; and
   removing the polysilicon spacer to form the insulating structure.

5. A method of forming a split-gate transistor according to claim 2, wherein:
   forming the protruding region includes forming a trench in a nitride layer;
   oxidizing a portion of a polysilicon layer formed below the nitride layer to form a silicon oxide region that extends under a peripheral portion of the nitride layer;
   filling the remainder of the trench with silicon oxide and planarizing the silicon oxide to expose an upper surface of the nitride layer;
   removing the nitride layer; and
   removing a silicon oxide pad layer formed under the nitride layer.

6. A method of forming a split-gate transistor according to claim 5, wherein:
   forming the protruding region includes a thinner distal portion having a tapered configuration, wherein an upper surface of the floating gate structure conforms to a lower surface of the protruding region, the thinner distal portion resulting in a corresponding increase floating gate thickness and forming an upwardly directed projection on the floating gate structure.

7. A method of forming a split-gate transistor comprising, in order:
   a) forming a mask pattern on a substrate, the mask pattern including a trench having substantially vertical sidewalls and exposing a portion of an insulating layer, the insulating layer being formed on a semiconductor layer;
   b) forming first polysilicon spacers adjacent the sidewalls;
   c) removing the exposed portion of the insulating layer and a portion of the semiconductor layer formed below the insulating layer, thereby removing a portion of the first polysilicon spacers to form reduced polysilicon spacers and forming an enlarged trench;
   d) filling the enlarged trench with a silicon oxide;
   e) removing the mask pattern and the reduced polysilicon spacers to form an oxide structure having sidewalls, each sidewall including a concave region and a protrusion arranged below the concave region;

f) using the oxide structure as an etch mask to remove a portion of the semiconductor layer and thereby form a floating gate structure arranged below the protrusion;

g) forming an insulating layer surrounding the floating gate; and h) forming a control gate structure adjacent the sidewall of the oxide structure, the control gate structure extending into the concave regions and thereby extending at least partially over a corresponding floating gate structure.

8. A method of forming a split-gate transistor according to claim 7, wherein:

the substrate includes a first insulating layer formed on the substrate, a first semiconductor layer formed on the first insulating layer, a second insulating layer formed on the first semiconductor layer, and a third insulating layer formed on the second insulating layer;

the third insulating layer is patterned and etched to form the mask pattern;

the insulating layer is formed by oxidizing a portion of the first semiconductor layer to form a semiconductor oxide layer; and the first polysilicon spacers are formed by depositing a polysilicon layer and etching polysilicon layer using an anisotropic etch.

9. A method of forming a split-gate transistor according to claim 8, wherein:

the control gate structures are formed by depositing a second semiconductor layer, the second semiconductor layer substantially conforming to a surface of the oxide structure and filling the concave regions; and anisotropically etching the second semiconductor layer to form semiconductor spacers adjacent the sidewalls of the oxide structure.

10. A method of forming a split-gate transistor according to claim 8, wherein:

the substrate is a semiconductor wafer;
the first insulating layer is silicon oxide;
the first semiconductor layer is polysilicon;
the second insulating layer is silicon oxide;
the third insulating layer is silicon nitride;
the semiconductor oxide layer is silicon oxide; and
the second semiconductor layer is polysilicon.

11. A method of forming a split conductor structure according to claim 10, wherein:

the semiconductor wafer is a p-type wafer;
the first insulating layer is silicon oxide having a thickness of about 50–150 Å;
the first semiconductor layer is polysilicon having a thickness of about 500–1500 Å;
the second insulating layer is silicon oxide having a thickness of about 30–100 Å;
the third insulating layer is silicon nitride having a thickness of about 2000–3000 Å;
the semiconductor oxide layer is silicon oxide having a thickness of about 500–1500 Å;
the polysilicon layer used to form the first polysilicon spacers has a thickness of about 1500–3000 Å;
the second semiconductor layer has a thickness of about 2000–4000 Å.

12. A method of forming a split-gate transistor according to claim 11, wherein:

the thickness of the first semiconductor layer, as deposited, is at least about 90% and no more than about 110% of the thickness of semiconductor oxide layer formed on the first semiconductor layer.

13. A method of forming a split-gate transistor according to claim 9, wherein:

a thickness of a portion of the first semiconductor layer underlying the semiconductor oxide layer is at least about 40% of the thickness of the first semiconductor layer as deposited.

14. A method of forming a split-gate transistor comprising, in order:

a) forming a first insulating layer on a substrate;

b) forming a first semiconductor layer on the first insulating layer;

c) forming a second insulating layer on the first semiconductor layer;

d) forming a third insulating layer on the second insulating layer;

e) patterning and etching the third insulating layer to form an opening that exposes a portion of the second insulating layer, the opening having substantially vertical sidewalls;

f) oxidizing a portion of the first semiconductor layer to form a semiconductor oxide layer;

g) depositing a second semiconductor layer;

h) etching the second semiconductor layer using an anisotropic etch to form spacers adjacent the sidewalls of the opening and expose a portion of the semiconductor oxide layer;

i) etching the exposed portion of the semiconductor oxide layer to expose a portion of the first semiconductor layer;

j) etching the exposed portion of the first semiconductor layer to expose a portion of the first insulating layer;

k) depositing a fourth insulating layer to a thickness sufficient to fill the opening;

l) removing an upper portion of the fourth insulating layer to expose a surface of the third insulating layer and produce a substantially planar surface;

m) removing the third insulating layer while substantially retaining the spacers to form a base structure;

n) removing the spacers to form a modified base structure having sidewalls that include a recessed area;

o) removing the second insulating layer;

p) etching the first semiconductor layer using the modified base structure as an etch mask to expose the first insulating layer and to form floating gate structures;

q) forming an insulating layer on the floating gate structures r) depositing a third semiconductor layer, the third semiconductor layer substantially conforming to a surface of the modified base structure and filling the recessed area in the sidewall;

s) etching the third semiconductor layer to form control gate structures adjacent the sidewalls of the base structure, wherein each of the control gate structures is paired with but is insulated from a corresponding floating gate structure, and further wherein a portion of each control gate structure at least partially overlays a corresponding floating gate structure; and t) depositing a fourth insulating layer to insulate the control gate structures.

15. A method of forming a split-gate transistor according to claim 14, wherein:

the substrate is a semiconductor wafer;
the first insulating layer is silicon oxide;
the first semiconductor layer is polysilicon;
the second insulating layer is silicon oxide;

the third insulating layer is silicon nitride;
the semiconductor oxide layer is silicon oxide;
the second semiconductor layer is polysilicon;
the fourth insulating layer is silicon oxide; and
the third semiconductor layer is polysilicon.

16. A method of forming a split-gate transistor according to claim 15, wherein:
the semiconductor wafer is a p-type wafer;
the first insulating layer is silicon oxide having a thickness of about 50–150 Å;
the first semiconductor layer is polysilicon having a thickness of about 500–1500 Å;
the second insulating layer is silicon oxide having a thickness of about 30–100 Å;
the third insulating layer is silicon nitride having a thickness of about 2000–3000 Å;
the semiconductor oxide layer is silicon oxide having a thickness of about 500–1500 Å;
the second semiconductor layer is polysilicon having a thickness of about 1500–3000 Å;
the fourth insulating layer is silicon oxide having a thickness of about 15,000 Å; and
the third semiconductor layer is polysilicon having a thickness of about 2000–4000 Å.

17. A method of forming a split-gate transistor according to claim 15, wherein:
the thickness of the first semiconductor layer, as deposited, is within about 10% of the thickness of semiconductor oxide layer formed on the exposed portion of the first semiconductor layer.

18. A method of forming a split-gate transistor according to claim 15, wherein:
a thickness of a portion of the first semiconductor layer underlying the semiconductor oxide layer is at least about 40% of the thickness of the first semiconductor layer as deposited.

19. A method of forming a non-volatile split-gate memory cell comprising, in order:
a) forming a first insulating layer on a substrate;
b) forming a first semiconductor layer on the first insulating layer;
c) forming a second insulating layer on the first semiconductor layer;
d) forming a third insulating layer on the second insulating layer;
e) patterning and etching the third insulating layer to form an opening that exposes a portion of the second insulating layer, the opening having substantially vertical sidewalls;
f) oxidizing a portion of the first semiconductor layer to form a semiconductor oxide layer;
g) depositing a sidewall material layer;
h) etching the sidewall material layer using an anisotropic etch to form spacers adjacent the sidewalls of the opening and to expose a portion of the semiconductor oxide layer;
i) etching the exposed portion of the semiconductor oxide layer to expose a portion of the first semiconductor layer;
j) etching the exposed portion of the first semiconductor layer to expose a portion of the first insulating layer;
k) implanting a dopant species through the exposed portion of the first insulating layer to form a source region in a portion of the substrate;
l) depositing a fourth insulating layer to a thickness sufficient to fill the opening;
m) removing an upper portion of the fourth insulating layer to expose a surface of the third insulating layer and produce a substantially planar surface;
n) removing the third insulating layer and the spacers to form an insulator structure, the insulator structure having sidewalls that include a recessed area;
o) removing the second insulating layer;
p) etching the first semiconductor layer using a remaining portion of the semiconductor oxide layer to expose the first insulating layer and form first conductor elements;
q) forming a fifth insulating layer on the first conductor elements;
r) depositing a second semiconductor layer, the second semiconductor layer substantially conforming to a surface of the insulator structure and filling the recessed area in the sidewalls;
s) etching the second semiconductor layer to form semiconductor spacers adjacent the sidewalls of the insulator structure and expose a portion of the first insulating layer, wherein each of the semiconductor spacers is a second conductor element that is paired with and partially overlays a corresponding first conductor element;
t) implanting a dopant species through the exposed portion of the first insulating layer to form a drain region in the substrate;
u) depositing a sixth insulating layer to insulate the second conductor element; and
v) establishing separate electrical connections to the source region, the drain region and the second conductor element.

20. A method of forming a non-volatile memory cell according to claim 19, wherein:
k) etching the exposed portion of the first semiconductor layer to expose a portion of the first insulating layer also removes a portion of the first spacer, thereby forming a reduced first spacer.

21. A method of forming a non-volatile memory cell according to claim 19, wherein:
k) etching the exposed portion of the first semiconductor layer includes an overetch duration, the overetch duration being selected to control a base width of the first spacer.

22. A method of forming a non-volatile memory cell according to claim 21, wherein:
the second conductor element overlays the first conductor element by an overlap length, the overlap length being controlled by controlling the base width of the first spacer.

23. A method of forming a non-volatile memory cell according to claim 19, wherein:
s) etching the second semiconductor layer to form the semiconductor spacers includes an overetch duration, the overetch duration being selected to control a base width of the semiconductor spacer.

24. A method of forming a non-volatile memory cell according to claim 23, wherein:
a surface region of the substrate extending generally between the source region and the drain region and underlying the first conductor element and the second conductor element serves as a channel region, the channel region having a channel length, and
further wherein the channel length is set by controlling the base width of the semiconductor spacer.

25. A method of forming a non-volatile memory cell according to claim 19, wherein:
- t) implanting a dopant species through the exposed portion of the first insulating layer to form a drain region in the substrate includes
  - t1) implanting a first dopant species through the exposed portion of the first insulating layer to form a lightly doped drain (LDD) region in the substrate;
  - t2) depositing a second sidewall material layer;
  - t3) etching the second sidewall material layer using an anisotropic etch to form second spacers adjacent the sidewalls of the semiconductor spacers to reduce the exposed portion of the first insulating layer; and
  - t4) implanting a second dopant species through the reduced exposed portion of the first insulating layer to complete the drain region.

26. A method of forming a non-volatile memory cell according to claim 25, wherein:
- the first dopant species is an n-type dopant and is implanted at a first dose; and
- the second dopant species is an n-type dopant and is implanted at a second dose, wherein a ratio of the first dose to the second dose is no more than 1:25.

* * * * *